United States Patent [19]

Haas et al.

[11] Patent Number: 5,487,211
[45] Date of Patent: Jan. 30, 1996

[54] METHOD FOR FABRICATING A SURFACE-MOUNTABLE CRYSTAL RESONATOR

[75] Inventors: Kevin L. Haas, Hoffman Estates; Ken A. Haas, Hanover Park; Kimber J. Vought, Wauconda, all of Ill.

[73] Assignee: Motorola, Inc., Schaumburg, Ill.

[21] Appl. No.: 109,222

[22] Filed: Aug. 19, 1993

[51] Int. Cl.[6] ............................. H01L 41/04; H03H 3/02; H04R 17/10
[52] U.S. Cl. ......................................... 29/25.35; 310/321
[58] Field of Search ..................................... 29/25.35, 594, 29/595; 310/365–368, 360, 361, 321

[56] References Cited

U.S. PATENT DOCUMENTS

| | | | |
|---|---|---|---|
| 4,370,785 | 2/1983 | Assenze et al. | 29/25.35 |
| 4,385,255 | 5/1983 | Yamaguchi et al. | 29/25.35 X |
| 4,409,711 | 10/1983 | Ballato et al. | 29/25.35 |
| 4,484,382 | 11/1984 | Kawashima | 29/25.35 |
| 4,649,310 | 3/1987 | Nakamura et al. | 29/25.35 X |

FOREIGN PATENT DOCUMENTS

| | | | |
|---|---|---|---|
| 0092515 | 10/1983 | European Pat. Off. | 310/321 |
| 54-12547 | 1/1979 | Japan | 29/25.35 |
| 608133 | 12/1978 | Switzerland | 29/25.35 |

*Primary Examiner*—Peter Vo
*Attorney, Agent, or Firm*—Christopher P. Moreno; Timothy W. Markison

[57] ABSTRACT

A surface-mountable crystal resonator (100) is provided in the following manner. A first predetermined electrode pattern (105) and a second predetermined electrode pattern (201) are formed on a first major surface (104) and a second major surface (200), respectively, of a piezoelectric crystal substrate (101). Additionally, a first predetermined attachment electrode pattern (106), electrically coupled to the second predetermined attachment electrode pattern, and a second predetermined attachment electrode pattern (202), electrically coupled to the first predetermined attachment electrode pattern, are formed on a first attachment area (102) and a second attachment area (103), respectively. The first and second attachment areas include extensions (107) that, when mounted, allow a conductive adhesive (301), placed on a mounting substrate (300), to flow and establish electrical connections with the first and second predetermined attachment electrode patterns.

4 Claims, 2 Drawing Sheets

METHOD FOR FABRICATING A SURFACE-MOUNTABLE CRYSTAL RESONATOR

FIELD OF THE INVENTION

The present invention relates generally to crystal resonators and, in particular, to methods for fabricating and mounting a surface-mountable crystal resonator.

BACKGROUND OF THE INVENTION

Crystal resonators are known to comprise a rectangular, piezoelectric crystal substrate having two substantially planar, parallel major surfaces on opposite sides of the crystal substrate. Electrodes are formed on the major surfaces such that a voltage applied across the electrodes causes the crystal substrate to resonate. In order for crystal resonators to be surface-mountable, provisions must be made such that electrical connections can be established between both the top and bottom electrodes and a mounting substrate. It is often difficult and/or costly, however, to establish electrical connections (typically through the use of solder or another electrically conductive adhesive) between the top electrode and the mounting substrate.

One solution to this problem is to use an automated device, such as a robotic arm, to place a "top dot" of conductive adhesive on the crystal resonator. This operation wraps conductive adhesive from a conductive pad on the mounting substrate, around the crystal substrate, to the top electrode such that a reliable electrical connection is created. Automated devices capable of such delicate operations are often very expensive, costing as much as one million dollars apiece, thus adding substantially to the overall cost of mounting each crystal resonator.

An alternative to this method is to fabricate the crystal resonator in such a way that a specialized automated device is not required to establish electrical connection with the top electrode. It is known, for instance, to place holes in the crystal substrate such that when the crystal resonator is mechanically placed on the mounting substrate, conductive adhesive already positioned on the conductive pad is allowed to flow through the crystal substrate and establish an electrical connection with the top electrode. A limitation of this method, however, is that the differing coefficients of expansion of the crystal substrate and the conductive adhesive can cause undo stresses on the crystal substrate when environmental conditions vary. These stresses, in turn, can adversely affect the performance of the crystal resonator. Therefore, a need exists for a surface-mountable crystal resonator that eliminates the need for additional automated mounting devices and overcomes the limitations of prior art solutions.

DESCRIPTION OF A PREFERRED EMBODIMENT

Generally, the present invention provides a method for fabricating a surface-mountable crystal resonator. The surface-mountable crystal resonator is fabricated to include at least a first attachment area. The first attachment area has at least one extension, such that, when the surface mountable crystal resonator is placed on a mounting substrate, the extension displaces a conductive adhesive to establish an electrical connection between an electrode of the resonator and an electrode of the mounting substrate. With such a device, the resonator may be surface mounted without the need for expensive placement equipment and without mounting holes in the resonator.

Figure 1:
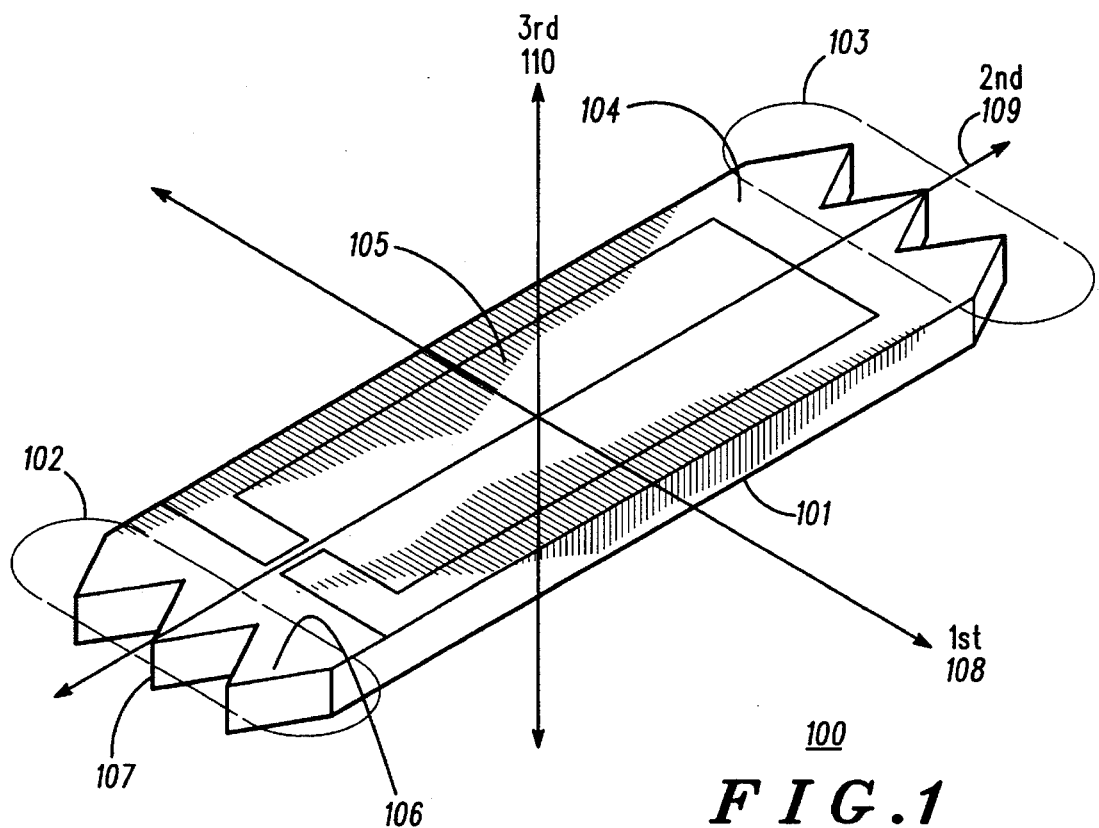
FIG. 1 illustrates a perspective view of a surface-mountable crystal resonator in accordance with the present invention.
Figure 2:
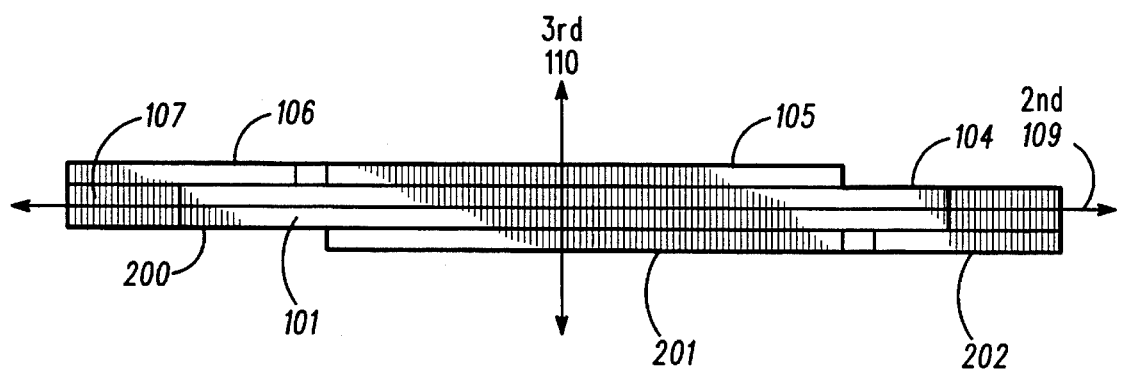
FIG. 2 illustrates a side view of a surface-mountable crystal resonator in accordance with the present invention.

The present invention can be more fully described with reference to FIGS. 1–4. FIGS. 1 and 2 illustrate a surface-mountable crystal resonator (100) that includes a piezoelectric crystal substrate (101) having first and second major surfaces (200, 104) that are substantially parallel to each other and to first and second major axes (108–109), and substantially perpindicular to a third major axis (110). In a preferred embodiment, the crystal substrate (101) is an AT-cut strip blank as known in the art. First and second attachment areas (102–103), parallel to either the first or second major axes (108, 109), are formed at each end of the crystal substrate (101) using known techniques such as quartz etching or milling. Each attachment area (102–103) is fabricated to include at least one extension (107). The extensions (107) have a predetermined shape based on a predetermined cut of the crystal substrate (101) and the conditions in which the crystal substrate (101) is to be mounted. For instance, if the predetermined cut of the crystal substrate (101) is an AT cut, the predetermined shape of the extensions (107) can be a triangle having first and second extension surfaces substantially perpendicular to each other and substantially at 45° angles with the first and second major axes (108–109).

Additionally, first and second electrodes (201, 105), each having a predetermined pattern, are formed on the first and second major surfaces (200, 104), respectively, thus forming an active area of resonance. As is known, the active area of resonance, when excited with an electrical potential, provides a mechanical vibration at the resonant frequency of the crystal (101). In a preferred embodiment, the predetermined pattern of the first and second electrodes (201, 105) is a rectangular shape.

In order to provide electrical paths to the first and second electrodes (201, 105), first and second attachment electrodes (106, 202), each having a predetermined shape, are formed on the second and first major surfaces (104, 200), respectively. In particular, the predetermined shape is such that the first and second attachment areas (102–103), including the extensions (107), are substantially covered by the first and second attachment electrodes (106, 202). As shown, the second electrode (105) and the first attachment electrode (106) are electrically coupled. Additionally, the first electrode (201) and the second attachment electrode (202) are electrically coupled. Note that the first and second electrodes (105, 201) and the first and second attachment electrodes (106, 202) are formed on their respective surfaces using know metallization and/or etching techniques. Having formed the surface-mountable crystal resonator (100) in accordance with the above teachings, a method of mounting such a resonator is further described with the aid of FIGS. 3 and 4.

Figure 3:
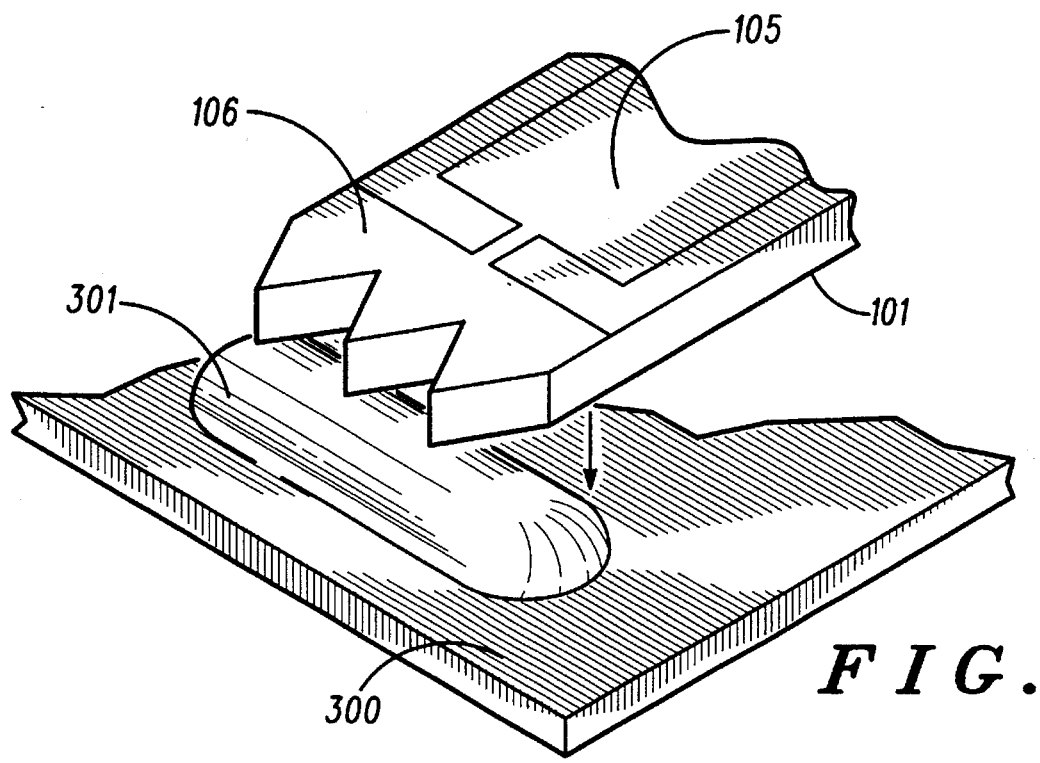
FIG. 3 illustrates an alignment of a surface-mountable crystal resonator in accordance with the present invention prior to mounting on a mounting substrate.

FIG. 3 illustrates an alignment of the surface-mountable crystal resonator (100) prior to mounting on a mounting substrate (300). A bead of conductive adhesive (301) is deposited at a first conductive area on the mounting substrate (300). In a preferred embodiment, the conductive adhesive (301) is either a conductive epoxy or solder. The resonator (100) is then placed such that the first attachment area (102) and the first attachment electrode (106) are above the conductive adhesive (301). The resonator (100) is then lowered such that the first attachment area (102) is placed in the conductive adhesive (301). The conductive adhesive (301) flows through the first attachment area (102) and establishes an electrical connection between the first attachment electrode (106) and the first conductive area. The predetermined shape of the extensions (107) allows the flow of the conductive adhesive (301) to wrap around the first attachment area (102) and make an electrical connection with the first attachment electrode (106). It is understood that the second attachment area (103) and the second attachment electrode (202) may be simultaneously placed over a second conductive area (not shown) having a bead of conductive adhesive. Thus, when the resonator (100) is lowered, the conductive adhesive can establish an electrical connection between the second attachment electrode (202) and the second conductive area. The fact that the second attachment electrode (202) directly faces, in this example, the conductive adhesive, virtually guarantees a proper electrical connection. The advantages provided by the present invention are more clearly seen in FIG. 4.

Figure 4:
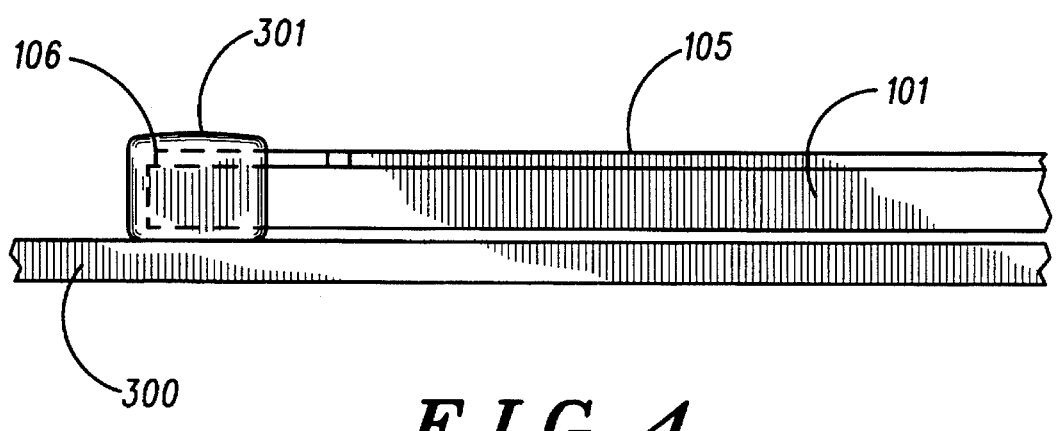
FIG. 4 illustrates a partial side view of a surface-mountable crystal resonator in accordance with the present invention after mounting on a mounting substrate.

FIG. 4 illustrates a side view of the resonator (100) after it has been properly mounted. The conductive adhesive (301) has established contact with the first attachment electrode (106) by flowing through the extensions (107) thus eliminating the need for another operation to electrically connect the conductive adhesive (301) to the first attachment electrode (106). By identically establishing the first and second attachment areas (102, 103) and their respective first and second attachment electrodes (106, 202) on opposite sides of each end of the crystal substrate (101), either the first or second major surface (200, 104) may be mounted facing the mounting substrate (300).

The present invention provides a method for a surface-mountable crystal resonator. With such a method, electrical connections can be made between electrodes facing away from the mounting substrate and conductive areas found on the mounting substrate without the use of a separate manufacturing operation. Furthermore, the present invention overcomes the limitations of the prior art in which a hole is etched through the crystal substrate in order to aid the creation of electrical connections. These problems are eliminated through the use of extensions which allow conductive adhesive to flow throughout those areas required to establish an electrical connection.

We claim:

1. A method for fabricating a surface-mountable crystal resonator, the method comprising the steps of:

a) forming a piezoelectric crystal substrate to have a first major surface, a second major surface, and a first attachment area, wherein the first major surface and second major surface are substantially co-planar separated by thickness of the piezoelectric crystal substrate and are parallel to a first major axis and a second major axis and perpendicular to a third major axis, wherein the first major axis, the second major axis, and the third major axis are substantially perpendicular to each other, and wherein the first attachment area is substantially parallel to the first major axis and includes at least two extensions, each of the at least two extensions comprising a first extension surface and a second extension surface, wherein the first extension surface is planar and substantially at 45 degree angles with respect to the first major axis and the second major axis and substantially parallel with respect to the third major axis, and wherein the second extension surface is planar and substantially at 45 degree angles with respect to the first major axis and the second major axis and substantially parallel with respect to the third major axis, and wherein the first extension surface and the second extension surface are substantially perpendicular;

b) forming, on the first major surface, a first predetermined electrode pattern;

c) forming, on the second major surface, a second predetermined electrode pattern, wherein the first predetermined electrode pattern and the second predetermined electrode pattern form an active area of resonance; and d) forming, on the first attachment area, a first predetermined attachment electrode pattern, wherein the first predetermined attachment electrode pattern is electrically coupled to the second predetermined electrode pattern.

2. The method of claim 1, step (a) further comprising the step of forming a second attachment area, wherein the second attachment area is substantially parallel to the first attachment area and includes at least two additional extensions having a predetermined shape identical to the at least two extension.

3. The method of claim 2 further comprises the steps of:

e) forming, on the second attachment area, a second predetermined attachment electrode pattern, wherein the second predetermined attachment electrode pattern is electrically coupled to the first predetermined electrode pattern.

4. The method of claim 1, step (a) further comprising the step of forming the piezoelectric crystal substrate, wherein the piezoelectric crystal substrate further comprises an AT cut.

\* \* \* \* \*